(12) United States Patent
Bartko et al.

(10) Patent No.: US 9,906,315 B1
(45) Date of Patent: Feb. 27, 2018

(54) TEST ARRANGEMENT AND TEST METHOD

(71) Applicant: Rohde & Schwarz GmbH & Co. KG, München (DE)

(72) Inventors: Hendrik Bartko, Unterhaching (DE); Adam Tankielun, Ottobrunn (DE); Alexander Pabst, Taufkirchen (DE); Thorsten Hertel, San Jose, CA (US)

(73) Assignee: ROHDE & SCHWARZ GMBH & CO. KG, München (DE)

( * ) Notice: Subject to any disclaimer, the term of this patent is extended or adjusted under 35 U.S.C. 154(b) by 0 days.

(21) Appl. No.: 15/587,515

(22) Filed: May 5, 2017

(51) Int. Cl.
*H04B 17/00* (2015.01)
*H04B 17/10* (2015.01)
*H01Q 3/04* (2006.01)
*H04B 7/0413* (2017.01)

(52) U.S. Cl.
CPC ............ *H04B 17/102* (2015.01); *H01Q 3/04* (2013.01); *H04B 7/0413* (2013.01)

(58) Field of Classification Search
CPC ....... H04B 17/102; H04B 7/0413; H01Q 3/04
See application file for complete search history.

(56) References Cited

U.S. PATENT DOCUMENTS 9,020,440 B2 4/2015 Kyosti
2017/0223559 A1* 8/2017 Kong ................. H04W 24/02

FOREIGN PATENT DOCUMENTS

CN 103298020 A 9/2013
EP 2627015 A2 8/2013

OTHER PUBLICATIONS

European Search Report for European Patent Application 16176808.0-1855, dated Dec. 13, 2016, 6 pages.

* cited by examiner

*Primary Examiner* — Nguyen Vo
(74) *Attorney, Agent, or Firm* — Westman, Champlin & Koehler, P.A.

(57) ABSTRACT

A test arrangement for testing a device under test comprises a rotatable device support for carrying the device under test at least rotatable in one axis, a first test antenna and a second test antenna, a first antenna positioning means for moving the first test antenna relative to the device under test in elevation direction, and a second antenna positioning means for moving the second test antenna relative to the device under test in azimuth direction and elevation direction.

29 Claims, 6 Drawing Sheets

TEST ARRANGEMENT AND TEST METHOD

TECHNICAL FIELD

The present invention relates to a test arrangement for testing a device under test. The present invention further relates to a respective test method.

BACKGROUND

Although applicable in principal to any wireless test system, the present invention and its underlying problem will be hereinafter described in combination with testing of beamforming of wireless devices.

In modern wireless communication systems the communication between the single devices is optimized by beamforming or beamsteering.

During development or production of devices for such communication systems it is therefore necessary to thoroughly test the beamsteering capabilities of the devices for compliance with communication standards and legal regulations.

Especially with beamforming devices it is therefore necessary to position the test antennas in a plurality of different positions around the respective device under test.

Against this background, the problem addressed by the present invention is to provide a versatile test equipment for beamforming capable devices.

SUMMARY

The present invention solves this object by a test arrangement with the features of claim 1 and a test method with the features of claim 15.

Accordingly it is provided:

A test arrangement for testing a device under test, the test arrangement comprising a rotatable device support for carrying the device under test at least rotatable in one axis, a first test antenna and a second test antenna, a first antenna positioning means for moving the first test antenna relative to the device under test in elevation direction, and a second antenna positioning means for moving the second test antenna relative to the device under test in azimuth direction and elevation direction.

A test method for testing a device under test, the method comprising carrying the device under test at least rotatable in one axis, moving a first test antenna relative to the device under test in elevation direction, moving a second test antenna relative to the device under test in azimuth direction and elevation direction, and testing the device under test with the first test antenna and the second test antenna.

The test arrangement of the present invention provides a plurality of moving supports or carriers for the device under test, DUT, the first test antenna and the second test antenna. These supports and carriers allow very flexibly positioning the DUT, the first test antenna and the second test antenna relative to each other.

With this arrangement a plurality of different scenarios may be used when testing the device under test. The test arrangement may e.g. be used to measure the beam forming properties of the DUT with the two antennas.

The first antenna positioning means can move the first test antenna in elevation direction to scan the antenna pattern or beamforming pattern of the antenna of the DUT in elevation direction. At the same time the second antenna positioning means can move the second test antenna in azimuth direction of the DUT, i.e. around the DUT, to scan the antenna pattern or beamforming pattern. In addition, the DUT may be rotated by the rotatable device support.

Instead of measuring with both antennas it is also possible to use one of the antennas to communicate with the DUT while the other antenna performs measurements on the DUT.

The first test antenna and/or the second test antenna may e.g. comprise single antennas and respective signal processing means may be attached to the antennas. As an alternative or in addition the first test antenna and/or second test antenna may comprise over the air power sensors, based e.g. power measurement diodes. Such OTA power sensors are e.g. disclosed in U.S. patent application Ser. No. 15/468,238, which is incorporated herein by reference.

Therefore, the present invention provides a very flexible test arrangement that allows flexibly positioning the DUT relative to two test antennas. At the same time the first test antenna and the second test antenna may be positioned relative to each other.

Further embodiments of the present invention are subject of the further subclaims and of the following description, referring to the drawings.

In a possible embodiment, the first antenna positioning means may comprise a guide with a slide and a controllable drive unit coupled to the guide and/or the slide, wherein the first test antenna may be coupled to the slide for controllably moving the first test antenna in elevation direction relative to the device under test.

The guide and the slide may e.g. form a kind of linear drive. The linear drive may e.g. comprise a linear motor or a threaded control rod. Such an arrangement allows easily moving the first test antenna relative to the DUT in elevation direction.

The first antenna positioning means may e.g. comprise a dragchain-like arrangement for carrying the cables that connect to the first test antenna.

In a possible embodiment, the guide may comprise an arc-shaped section that extends from a side of the rotatable device support to over the rotatable device support.

The arc-shaped section may comprise almost the same distance to the DUT for all points on the arc. The first test antenna may therefore be moved on the arc-shaped section on a radius around the DUT and take measurements from a constant distance to the DUT in different positions.

In a possible embodiment, the second antenna positioning means may comprise an azimuth positioner for positioning the second test antenna relative to the device under test in azimuth direction, e.g. for rotating the second test antenna around the DUT. In addition or as alternative, the second antenna positioning means may comprise an elevation positioner for positioning the second test antenna relative to the device under test in elevation direction.

The azimuth positioner may e.g. be a rotating table or a circular guide with a slide, like e.g. in a linear drive, attacked to the guide. The azimuth positioner may carry the elevation positioner. Therefore, the second test antenna can be positioned rotatably around the DUT and in elevation direction after or while rotating to the required position.

The azimuth positioner may e.g. comprise sliding contacts for coupling fixed cables to cables that rotate with the second test antenna to contact the second test antenna. This allows infinitely rotating the azimuth positioner.

However, the azimuth positioner may also comprise a cable harness that allows the azimuth positioner to rotate a specific amount, e.g. 360° or 720° or any other amount.

In a possible embodiment, the elevation positioner may comprise a vertical guide and a slide, wherein the second test antenna may be coupled to the slide. Further, the elevation positioner may comprise a controllable drive unit coupled to the guide and/or the slide, wherein the drive unit controllably may move the slide on the guide.

The guide and the slide may e.g. form a kind of linear drive. The linear drive may e.g. comprise a linear motor or a threaded control rod. Such an arrangement allows easily moving the second test antenna relative to the DUT.

The elevation positioner may e.g. comprise a dragchain-like arrangement for carrying the cables that connect to the second test antenna.

In a possible embodiment, the vertical guide of the elevation positioner may comprise an arc-shaped section that extends from a side of the rotatable device support to over the rotatable device support.

The arc-shaped section may comprise almost the same distance to the DUT for all points on the arc. The antenna can be moved on the arc-shaped section on a radius around the DUT and take measurements from a constant distance to the DUT in different positions.

In a possible embodiment, the first antenna positioning means and/or the second antenna positioning means may comprise a gantry-like arrangement.

The gantry-like arrangements may e.g. be interposed. One of the gantry-like arrangements may e.g. be smaller in width and height than the second gantry and be arranged under the other gantry. The test antennas or at least the test antenna of the larger gantry may e.g. be provided on extendable or telescopic arrangements such that the respective antenna can be retracted while the gantry is moved, e.g. rotated. The gantry-like arrangements may further comprise slides and/or guides to position the antennas in horizontal direction.

The gantry-like arrangements may be gantry-like arrangements with two side posts or only one side post. The side post(s) of the gantry-like arrangements may e.g. be arranged on a circular rail or guide that allows rotating the gantry-like arrangements. Single side post gantry-like arrangements may also comprise robot arms with a plurality of hinges or joints.

In a possible embodiment, the first test antenna and/or the second test antenna may comprise a switchable array of antenna elements.

Switchable in this context means that one of the antenna elements of the antenna array may be controllably selected for communication with the DUT or for measuring signals emitted by the DUT.

The single antenna elements may be positioned on the movement path that the respective first or second test antenna would move if moved by the respective positioning means.

The movement of the antenna elements may therefore be a virtual movement that may be performed simply by selecting the required antenna element.

In a possible embodiment, the rotatable device support may comprise a rotation device for rotating the device under test.

The rotation device may be any mechanical arrangement that allows rotating the DUT. Such a mechanical arrangement can e.g. comprise a rotating table or post that carries the DUT. With the rotation device the DUT may be rotated about a vertical axis. It is understood that the DUT may e.g. be positioned on the vertical axis.

In a possible embodiment, the rotatable device support may comprise an elevation device for moving the device under test in a vertical axis.

Different DUTs may have the antenna provided at different positions. With the elevation device independent of the respective DUT different DUTs may be positioned such that the antennas of the DUTs are at the predetermined height. This allows focusing the first test antenna and the second test antenna onto the predetermined height. No further focusing of the first test antenna and the second test antenna will then be necessary if different DUTs are used.

The elevation device may e.g. be provided as a telescopic post or the like.

In a possible embodiment, the test arrangement may comprise a test controller communicatively coupled to the first test antenna and the second test antenna, wherein the test controller may communicate beamforming instructions to the device under test via at least one of the first test antenna and the second test antenna.

The test controller serves to perform the actual testing of the DUT and the beam steering capabilities of the DUT.

For testing the beam steering capabilities it is necessary to instruct the DUT on how to or where to steer the antenna beam. The test controller may therefore provide respective beamforming instructions to the DUT.

In order to communicate the beamforming instructions to the DUT, the test controller may comprise a communication stack or a base station simulator that allows the test controller to establish the required communication with the DUT. Such a communication may require a complete base station to be simulated. Alternatively, such a communication may only require specific control messages to be transmitted to the DUT. The test controller may therefore comprise the required communication stack or base station simulator for the respective type of DUT.

In a possible embodiment, the test controller may measure emissions of the device under test via at least one of the first test antenna and the second test antenna and/or the test controller may transmit test signals to the device under test via at least one of the first test antenna and the second test antenna.

The test controller may perform the measurement with the DUT as receiver or the DUT as transmitter. If the DUT is used as transmitter, the test controller may first provide respective beamforming instructions to the DUT via the first or the second test antenna. The test controller may then use either the first test antenna, the second test antenna or both test antennas to measure the signals emitted by the DUT.

Further, the test controller may e.g. permanently use one of the test antennas to communicate with the DUT and at the same time use the other test antenna to measure e.g. the lobes or beams of the antenna of the DUT. The test antenna that communicates with the DUT may e.g. be positioned by the test controller in the focus of the main lobe of the antenna of the DUT. The other test antenna may then e.g. scan the surrounding space of the DUT to verify if the main lobe is provided as requested and to further verify or detect the existence of wanted/unwanted side lobes.

While such tests are performed the test controller may freely move the device under test, the first test antenna and the second test antenna.

Just as an example, the test controller may e.g. use the second test antenna to communicate with the device under test. During the test the position of the second test antenna may e.g. be fixed relative to the DUT. The first antenna may therefore be used to perform the measurements. For scanning the surroundings of the DUT the test controller can now either rotate the first test antenna around the DUT or rotate the DUT and the second test antenna while the first test antenna stays in position. It is understood, that the test antennas may also be switched, i.e. the first test antenna communicates with the DUT and the second test antenna performs the measurement. Further, it is understood that instead of measuring, signals may be transmitted to the DUT.

If the DUT is used as receiver, signals may be transmitted to the DUT from one or both of the test antennas. The test controller may comprise a dedicated communication interface to communicate with the DUT and e.g. receive the measurement results from the DUT.

The test controller may e.g. comprise a memory for storing test setups and test sequences. The test setups and test sequences may e.g. define the beamforming instructions that have to be provided to the DUT and the positions for the first and second test antennas that should be used to measure/transmit signals from/to the DUT and/or communicate with the DUT.

In a possible embodiment, the test controller may comprise a function switch that may switch the first test antenna and/or the second test antenna from a communication function to a measurement function or from a measurement function to a communication function.

The function switch may e.g. be used by the test controller if the DUT only requires a short or singular communication to provide the beamforming instructions to the DUT.

The test controller may e.g. command the DUT to perform a specific beamforming. The DUT may then continue with the specific beamforming, either as transmitter or receiver, even if no further communication is performed between the test controller and the DUT.

The test controller may then switch the test antenna that was used for transmitting the beamforming instructions to the measurement mode and perform measurements or transmissions with both test antennas.

It is understood, that the test controller may also repeatedly switch a test antenna from communication mode to measurement mode back and forth. The test controller may e.g. move the respective test antenna after a measurement is performed and command the DUT to provide a lobe or beam to the new position of the DUT and then perform the measurement with the same test antenna.

In a possible embodiment, the test controller may provide beamforming instructions to the device under test that instruct the device under test to configure the antenna with a plurality of beams and sequentially performs measurements for the single beams.

In modern communication systems the single devices may communicate with other devices via more than one route. Such systems may e.g. be called MIMO systems. In such MIMO systems the single devices have antennas that provide more than one beam or main lobe. Such antennas or antenna arrays with a plurality of antennas may therefore transmit and receive signals via more than one route at the same time.

Since the use of MIMO systems will increase in future communication technologies, it will be necessary to perform intensive testing of the devices for such systems.

As already indicated above DUTs with MIMO capabilities will transmit or receive signals via more than one main lobe or beam.

The test controller may therefore instruct the DUT to set specific beams or lobes and then sequentially measure the properties of the single beams or lobes. It is understood, that such tests may be performed with the DUT as transmitter or as receiver.

BRIEF DESCRIPTION OF THE DRAWINGS

For a more complete understanding of the present invention and advantages thereof, reference is now made to the following description taken in conjunction with the accompanying drawings. The invention is explained in more detail below using exemplary embodiments which are specified in the schematic figures of the drawings, in which.

The appended drawings are intended to provide further understanding of the embodiments of the invention. They illustrate embodiments and, in conjunction with the description, help to explain principles and concepts of the invention. Other embodiments and many of the advantages mentioned become apparent in view of the drawings. The elements in the drawings are not necessarily shown to scale.

In the drawings, like, functionally equivalent and identically operating elements, features and components are provided with like reference signs in each case, unless stated otherwise.

DETAILED DESCRIPTION OF THE DRAWINGS

Figure 1:
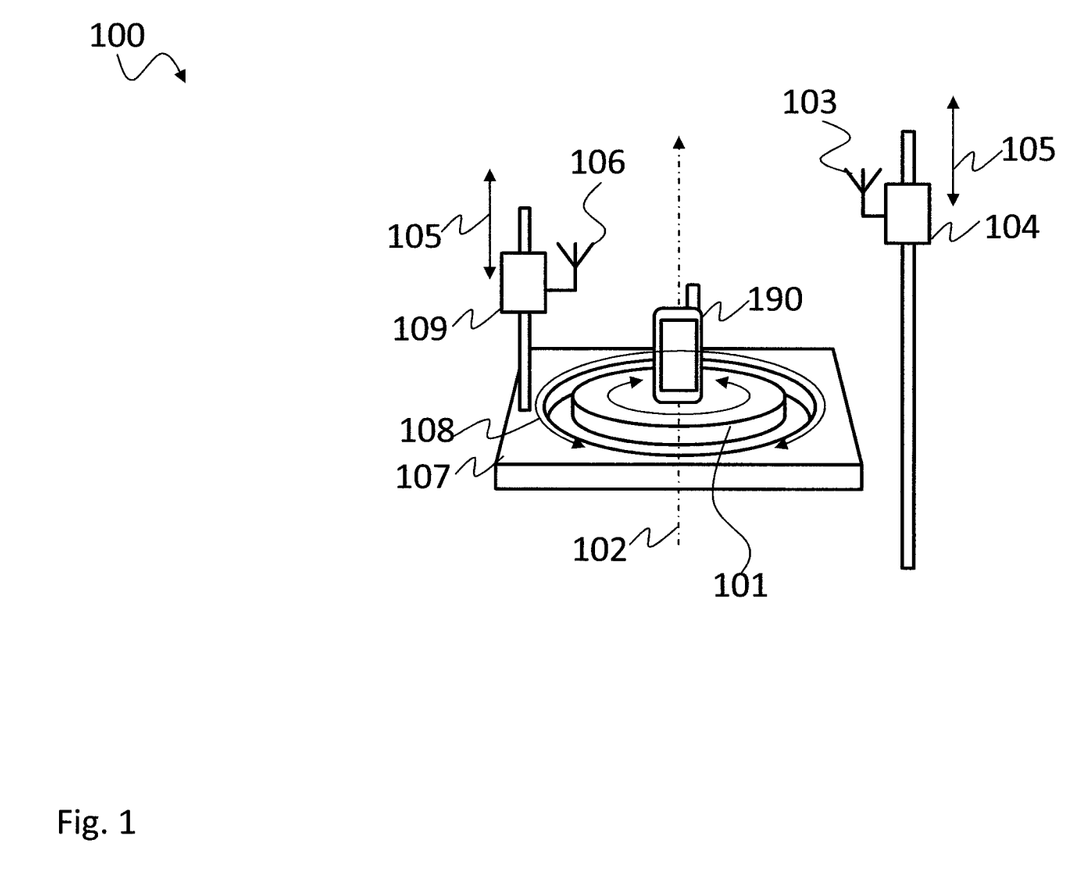
FIG. 1 shows a schematic drawing of an embodiment of a test arrangement according to the present invention.

FIG. 1 shows a schematic drawing of a test arrangement 100. The test arrangement 100 comprises a rotatable device 101 that carries the device under test 190. The rotatable device 101 is shown as a table with the device under test 190 positioned in the center of the table. The device under test 190 is shown as a smartphone. However, it is understood that the device under test 190 may be any device that communicates at least via a wireless interface or may even be a single antenna. The device under test 190 may however also comprise further interfaces, e.g. for test data or test command transmission.

The test arrangement 100 further comprises a first test antenna 103 that is arranged on a first antenna positioning means 104. A second test antenna 106 is arranged on a second antenna positioning means 107. The second antenna positioning means 107 comprises a guide arrangement 109 that carries the second test antenna 106.

The rotatable device 101 is rotatable about a vertical axis 102. The device under test 190 is positioned in the center of the rotatable device 101 and the vertical axis 102 crosses the device under test 190. It is understood, that this arrangement is just exemplary and that the device under test 190 may also be positioned out of axis, e.g. next to the vertical axis 102.

The first antenna positioning means 104 is shown as a rod and the first test antenna 103 is movable up and down in elevation direction 105 with regard to the device under test 190 on the rod. The same applies to the second test antenna 106 in the guide arrangement 109.

The second antenna positioning means 107 is shown as a table that surrounds the rotatable device 101 and has a recess where the rotatable device 101 is positioned. The second antenna positioning means 107 is also rotatable around the vertical axis 102. This means that the guide arrangement 109 with the second test antenna 106 may be rotated around the device under test 190 independently of the rotation of the rotatable device 101.

The test arrangement 100 provides one degree of freedom for the first test antenna 103, the up/down-movement, and two degrees of freedom for the second test antenna 106, the up/down-movement and the rotation around the vertical axis 102. Finally, the test arrangement 100 provides one degree of freedom for the device under test 190, the rotation around the vertical axis 102.

Therefore, with the test arrangement 100 signal sources or sensors, e.g. the device under test 190, the first test antenna 103 and/or the second test antenna 106, may be flexibly positioned relative to each other in a mechanical arrangement of low complexity.

The rotatable device 101 may e.g. comprise an electric motor that is arranged below the table and drives the table directly or via a gear drive. The electric motor may also be placed separately to the table and drive the table via a belt, a chain or the like. Any other means for positioning the table may also be used.

The first antenna positioning means 104 and the guide arrangement 109 may e.g. comprise a linear actuator arrangement, e.g. comprising threaded rods or the like and respective carriages that move on the threaded rod when it is turned e.g. by an electric motor. Linear motors may also be used to move the first test antenna 103 and the second test antenna 106.

Although not shown, it is understood that the test arrangement 100 may comprise a controller that controls movement and positions of the device under test 190, the first test antenna 103 and the second test antenna 106. Such a controller may also perform measurements, i.e. receive measurement signals from the first test antenna 103, the second test antenna 106 or the device under test 190, and transmit test signals via the first test antenna 103, the second test antenna 106 or the device under test 190. An exemplary test controller will be described in conjunction with FIG. 5.

Figure 2:
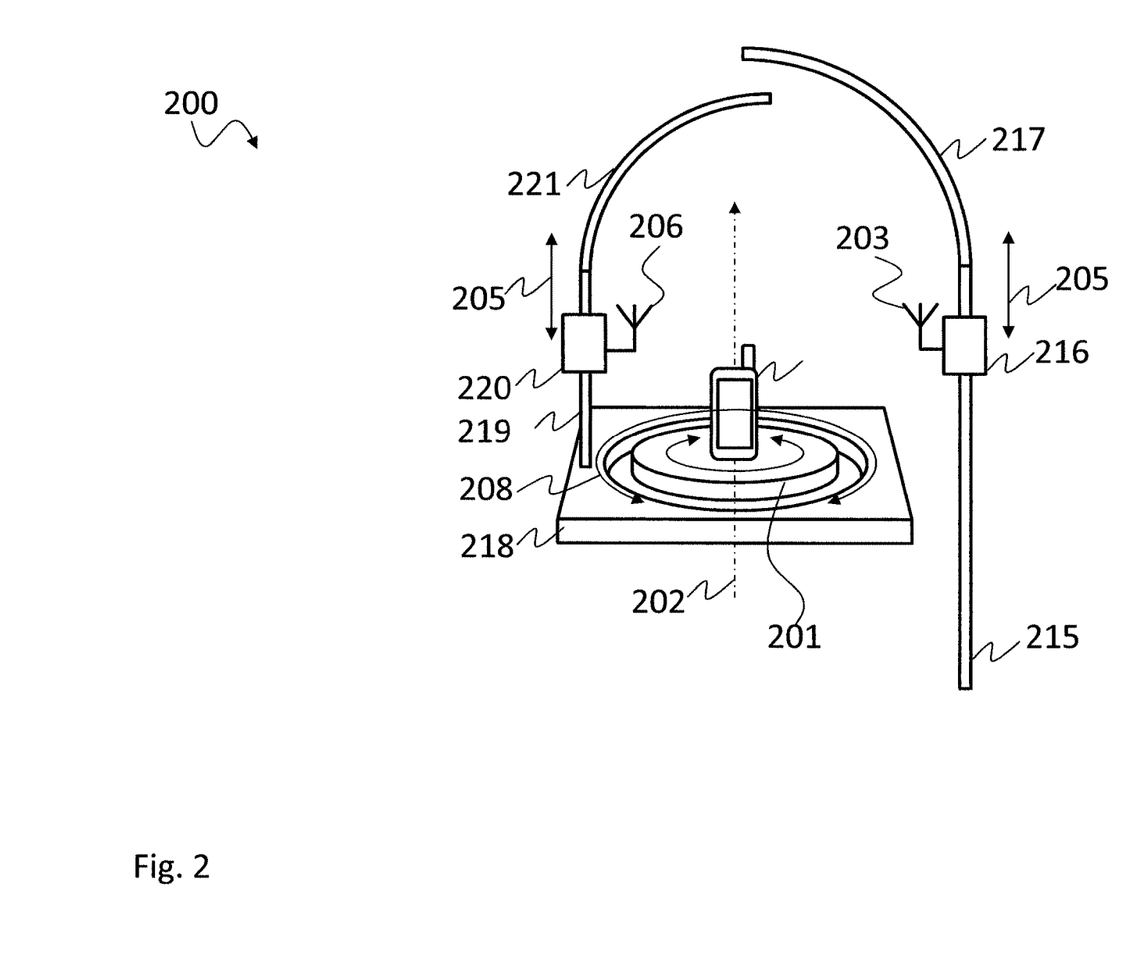
FIG. 2 shows a schematic drawing of another embodiment of a test arrangement according to the present invention.

FIG. 2 shows a schematic drawing of another test arrangement 200. The test arrangement 200 is based on the test arrangement 100. Therefore, the test arrangement 200 comprises the rotatable device 201 that rotatably carries the device under test 290, the first test antenna 203 on the first antenna positioning means (not separately referenced), and the second antenna positioning means (not separately referenced) with the guide arrangement (not separately referenced).

In the test arrangement 200 the first antenna positioning means comprises a guide 215 or rod that guides a carriage or slide 216. The slide 216 carries the first test antenna 203. The guide 215 comprises an arc-shaped section 217 on the top that extends from a side of the rotatable device 201 to over the rotatable device 201.

By moving the slide 216 along the arc-shaped section 217, the first test antenna 203 can be moved on a radius around the device under test 290 and measurements may be performed with the first test antenna 203 with about the same distance from the device under test 290 in different positions.

In the test arrangement 200 the second antenna positioning means comprises an azimuth positioner 218 that may be provided as the rotatable table 107 described in conjunction with FIG. 1. A vertical guide 219 or rod is arranged on the azimuth positioner 218. This means that the vertical guide 219 turns with the azimuth positioner 218. The second test antenna 206 is arranged on a slide 220 or carriage that may move on the vertical guide 219. The vertical guide 219 also comprises an arc-shaped section 221 on the top that extends from a side of the rotatable device 201 to over the rotatable device 201. The vertical guide 219 with the arc-shaped section 221 is lower than the guide 215 with the arc-shaped section 217. The guide 215 with the arc-shaped section 217 may therefore rotate around the vertical guide 219 with the arc-shaped section 221 without colliding.

It is understood, that the arc-shaped section 217 and the arc-shaped section 221 are optional and that anyone or both of the arc-shaped sections 217, 221 may be omitted.

Figure 3:
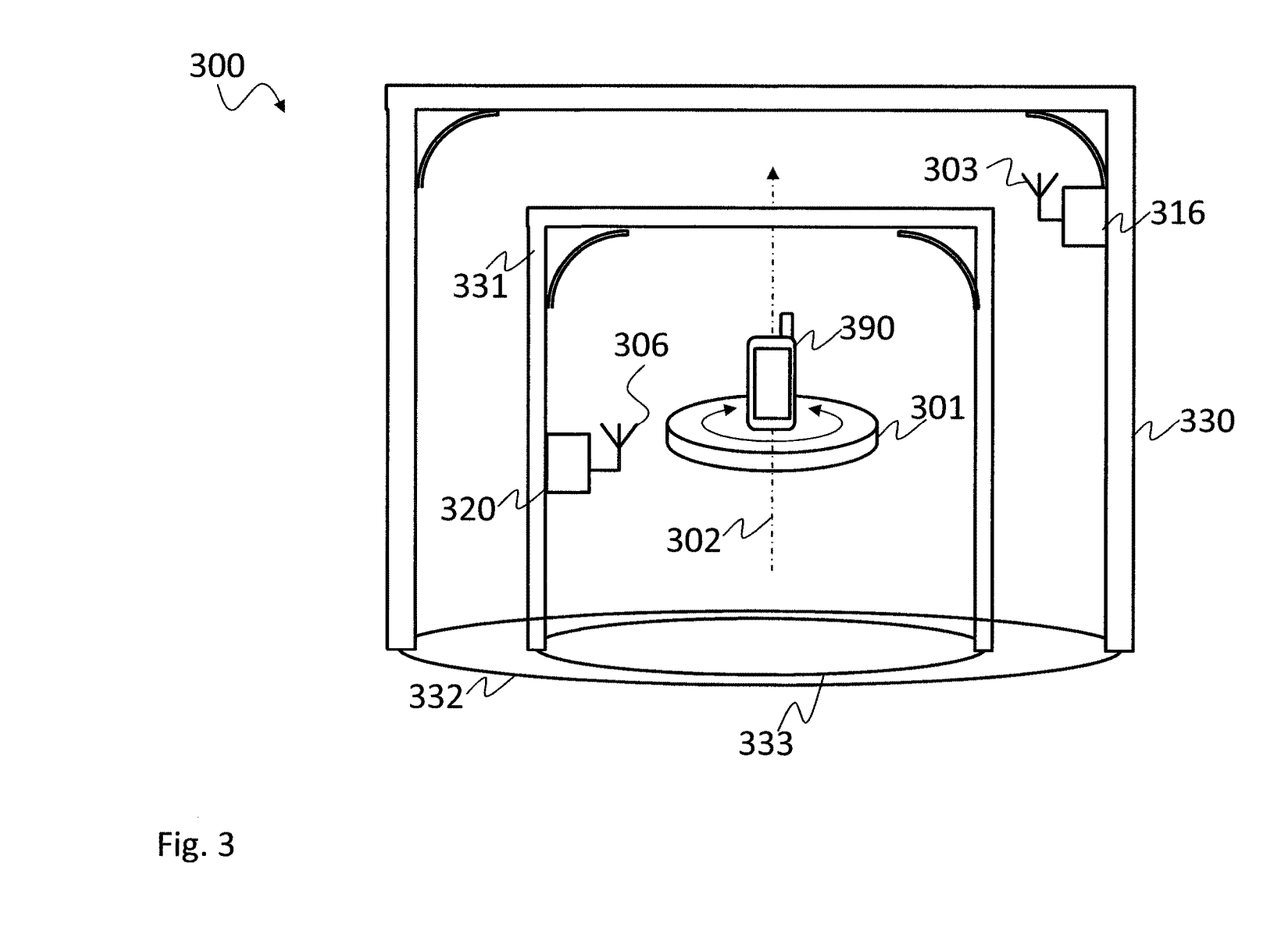
FIG. 3 shows a schematic drawing of another embodiment of a test arrangement according to the present invention.

FIG. 3 shows a schematic drawing of another test arrangement 300. The test arrangement 300 provides the same degrees of freedom as the test arrangement 100 and the test arrangement 200 but with different mechanical constructions.

The test arrangement 300 comprises an outer gantry arrangement 330 and an inner gantry arrangement 331. The gantry arrangements 330, 331 are both provided on circular rails 332, 333 or guides, which allow turning the outer gantry arrangement 330 and the inner gantry arrangement 331 around the vertical axis 302.

Although not shown in detail, the outer gantry arrangement 330 and the inner gantry arrangement 331 may comprise any type of rails or guides and slides 316, 320 as discussed above for moving the first test antenna 303 and the second test antenna 306. The brackets in the corners of the outer gantry arrangement 330 and the inner gantry arrangement 331 indicate that the slides 316, 320 may freely move on the circumference of the outer gantry arrangement 330 and the inner gantry arrangement 331.

It is understood that the features of the test arrangement 100, and the test arrangement 200 may be mixed with the features of the test arrangement 300. An exemplary test arrangement may e.g. comprise the outer gantry arrangement 330 and the second antenna positioning means 107 or the azimuth positioner 218 with the vertical guide 219 and optionally the arc-shaped section 221. Another exemplary test arrangement may also comprise the inner gantry arrangement 331 with the first antenna positioning means 104 and optionally the arc-shaped section 217.

Figure 4:
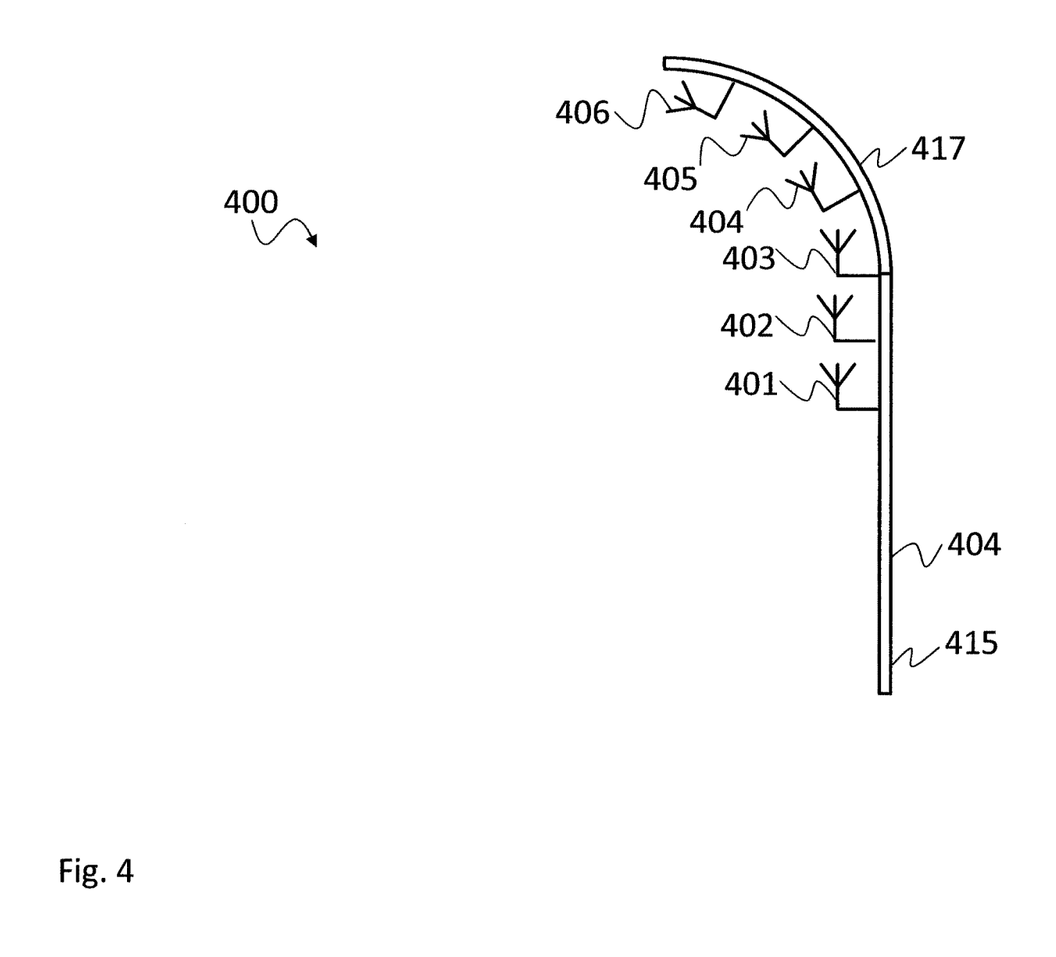
FIG. 4 shows a schematic drawing of another embodiment of a test arrangement according to the present invention.

FIG. 4 shows a schematic drawing of another test arrangement 400. In FIG. 4 only the first antenna positioning means 404 is exemplarily shown. It is however understood, that the antenna array with the antenna elements 401-406 shown in FIG. 4 may also be used e.g. on the second antenna positioning means 107 as well as the outer gantry arrangement 330 and the inner gantry arrangement 331.

The first antenna positioning means 404 comprises the rod 415 and the arc-shaped section 417. But instead of carrying a slide, the first antenna positioning means 404 carries an antenna array with exemplary six antennas 401-406.

With the arrangement of FIG. 4 movement of the first test antenna may be virtually performed by selecting one of the antennas 401-406 for receiving or transmitting signals.

If the first test antenna is to be virtually moved to another position, only another one of the antennas 401-406 has to be selected.

In addition, two different antennas 401-406 of the antenna array may be used for sending and receiving signals.

Figure 5:
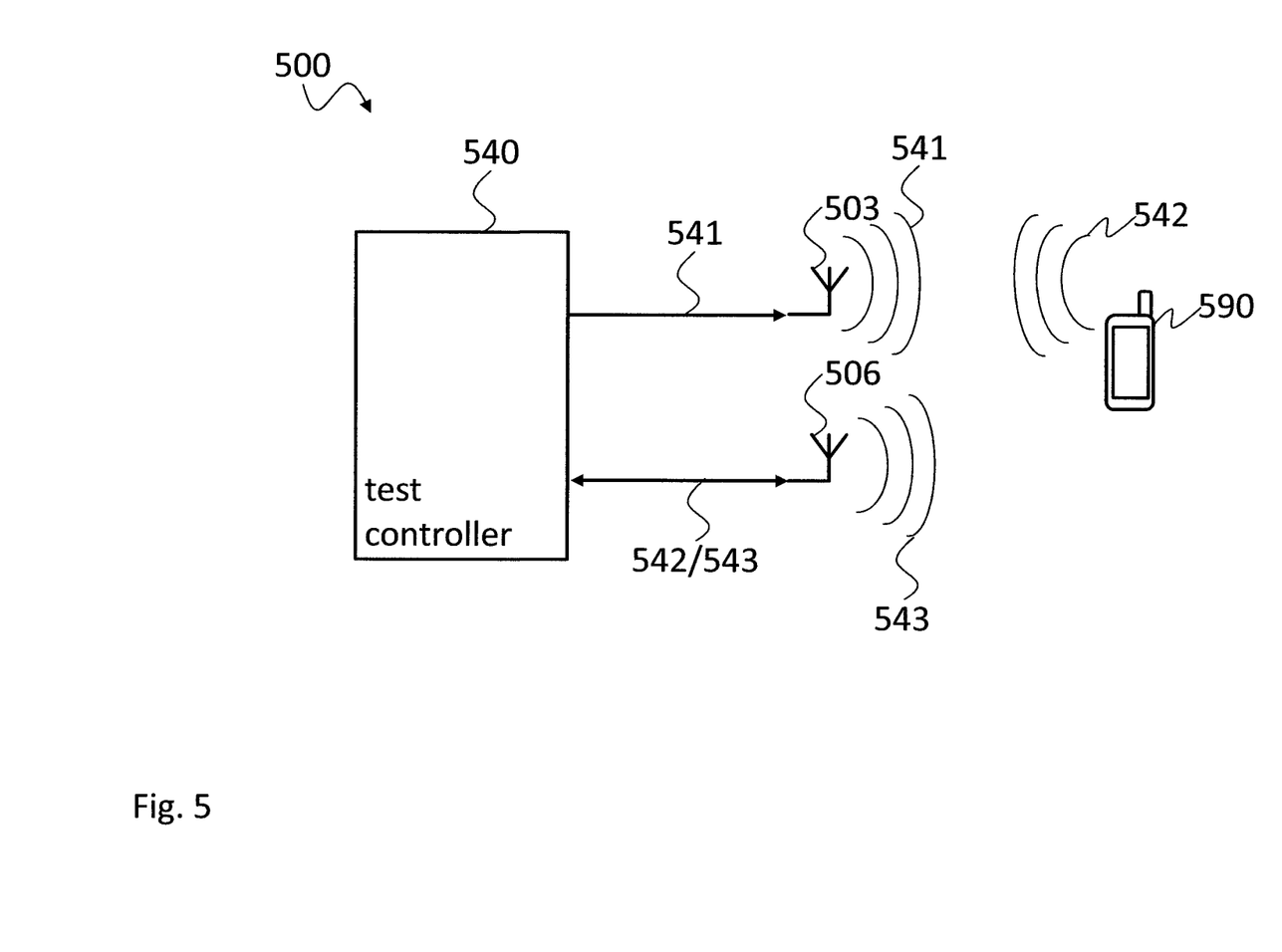
FIG. 5 shows a schematic drawing of another embodiment of a test arrangement according to the present invention.

FIG. 5 shows a schematic drawing of another test arrangement 500. The test arrangement 500 shows an exemplary electronic arrangement that may be used with the arrangements shown in FIGS. 1-4.

The test arrangement 500 comprises a test controller 540 that is connected to the first test antenna 503 and the second test antenna 506. The test controller 540 may use either one of the test antennas 503, 506 to send and receive signals.

The test arrangement 500 is shown in a state, where the test controller 540 selected the first test antenna 503 for transmitting beamforming instructions 541 to the device under test 590. The second test antenna 506 is used to receive emissions 542 from the device under test 590 and transmit test signals 543 to the device under test 590.

During a test the test controller 540 may switch the functions of the first test antenna 503 and second test antenna 506 as required.

The test controller 540 may e.g. move the first test antenna 103 into a position that allows the test controller 540 to communicate the beamforming instructions 541 to the device under test 590 and at the same time scan the surrounding area of the device under test 590 with the second test antenna 506.

The test controller 540 may also change the function of the first test antenna 503 and the second test antenna 506 while performing the test. The test controller 540 may e.g. use the first test antenna 103 to provide beamforming instructions 541 and maybe other test instructions to the device under test 590. The test controller 540 may then switch the first test antenna 503 into a measurement mode to measure signals with the first test antenna 503 and the second test antenna 506 at the same time.

The test controller 540 may also instruct the device under test 590 to provide multiple lobes or beams and then consecutively scan the surroundings of the device under test 590 for the single lobes or beams.

For sake of clarity in the following description of the method based FIG. 6 the reference signs used above in the description of apparatus based FIGS. 1-5 will be maintained.

Figure 6:
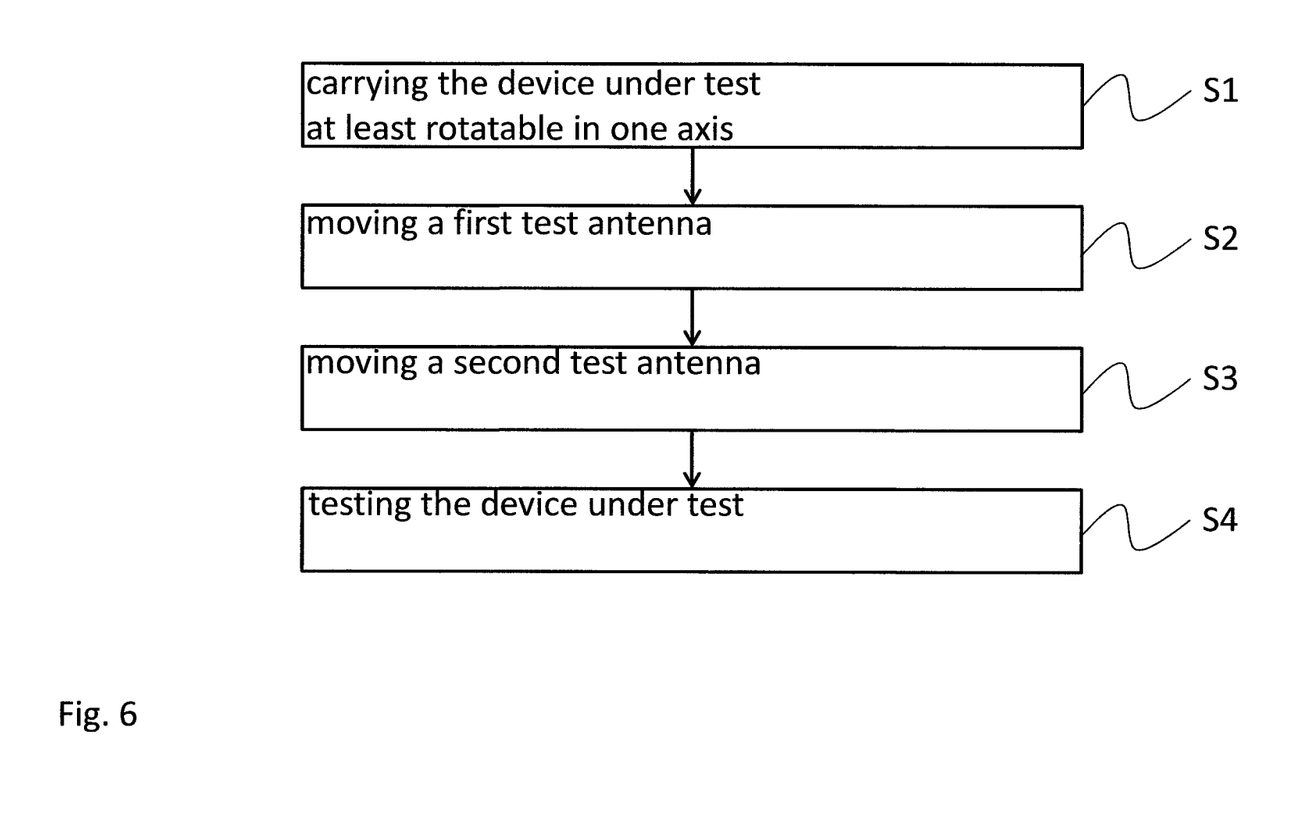
FIG. 6 shows a flow diagram of an embodiment of a test method according to the present invention.

FIG. 6 shows a flow diagram of an embodiment of a test method for testing a device under test 190, 290, 390, 590.

The method comprises carrying S1 the device under test 190, 290, 390, 590 at least rotatable in one axis 102, 202, 302, moving S2 a first test antenna 103, 203, 303 relative to the device under test 190, 290, 390, 590 in elevation direction 105, 205, moving S3 a second test antenna 106, 206, 306 relative to the device under test 190, 290, 390, 590 in azimuth direction 108, 208 and elevation direction 105, 205. Finally, the method comprises testing S4 the device under test 190, 290, 390, 590 with the first test antenna 103, 203, 303 and the second test antenna 106, 206, 306.

Moving S2 the first test antenna 103, 203, 303 may comprise coupling the first test antenna 103, 203, 303 to a slide 216 and moving the slide 216 on a guide 215 in elevation direction 105, 205 relative to the device under test 190, 290, 390, 590. In addition, moving the slide 216 may comprise moving the slide 216 on an arc-shaped section 217 of the guide 215 that extends from a side of the device under test 190, 290, 390, 590 to over the device under test 190, 290, 390, 590.

Moving S3 the second test antenna 106, 206, 306 may comprise positioning the second test antenna 106, 206, 306 relative to the device under test 190, 290, 390, 590 in azimuth direction 108, 208 and positioning the second test antenna 106, 206, 306 relative to the device under test 190, 290, 390, 590 in elevation direction 105, 205. In addition, positioning the second test antenna 106, 206, 306 in elevation direction 105, 205 may comprise moving a slide 220 on a vertical guide 219, wherein the second test antenna 106, 206, 306 is coupled to the slide 220. Further, moving the slide 220 may comprise moving the slide 220 on an arc-shaped 221 section of the guide 219 that extends from a side of the device under test 190, 290, 390, 590 to over the device under test 190, 290, 390, 590.

As an alternative or in addition to the above, moving the first test antenna 103, 203, 303 and/or moving the second test antenna 106, 206, 306 may also comprises moving the respective antenna with a gantry-like arrangement 330, 331.

As a further alternative or in addition to the above, moving the first test antenna 103, 203, 303 and/or moving the second test antenna 106, 206, 306 may also comprises selecting an antenna element 401-406 of a switchable array of antenna elements 401-406.

Carrying S1 the device under test 190, 290, 390, 590 may comprises rotating the device under test 190, 290, 390, 590 or moving the device under test 190, 290, 390, 590 in a vertical axis 102, 202, 302.

Testing S4 may comprise communicating beamforming instructions 541 to the device under test 190, 290, 390, 590 via at least one of the first test antenna 103, 203, 303 and the second test antenna 106, 206, 306. Further, testing S4 may comprise measuring emissions 542 of the device under test 190, 290, 390, 590 via at least one of the first test antenna 103, 203, 303 and the second test antenna 106, 206, 306 and/or transmitting test signals 543 to the device under test 190, 290, 390, 590 via at least one of the first test antenna 103, 203, 303 and the second test antenna 106, 206, 306.

Further, the first test antenna 103, 203, 303 and/or the second test antenna 106, 206, 306 may be switched from a communication function to a measurement function or from a measurement function to a communication function.

Finally, testing may also comprise providing beamforming instructions 541 to the device under test 190, 290, 390, 590 that instruct the device under test 190, 290, 390, 590 to configure the antenna with a plurality of beams and sequentially performing measurements for the single beams.

Although specific embodiments have been illustrated and described herein, it will be appreciated by those of ordinary skill in the art that a variety of alternate and/or equivalent implementations exist. It should be appreciated that the exemplary embodiment or exemplary embodiments are only examples, and are not intended to limit the scope, applicability, or configuration in any way. Rather, the foregoing summary and detailed description will provide those skilled in the art with a convenient road map for implementing at least one exemplary embodiment, it being understood that various changes may be made in the function and arrangement of elements described in an exemplary embodiment without departing from the scope as set forth in the appended claims and their legal equivalents. Generally, this application is intended to cover any adaptations or variations of the specific embodiments discussed herein.

In the foregoing detailed description, various features are grouped together in one or more examples or examples for the purpose of streamlining the disclosure. It is understood that the above description is intended to be illustrative, and not restrictive. It is intended to cover all alternatives, modifications and equivalents as may be included within the scope of the invention. Many other examples will be apparent to one skilled in the art upon reviewing the above specification.

Specific nomenclature used in the foregoing specification is used to provide a thorough understanding of the invention. However, it will be apparent to one skilled in the art in light of the specification provided herein that the specific details are not required in order to practice the invention. Thus, the foregoing descriptions of specific embodiments of the present invention are presented for purposes of illustration and description. They are not intended to be exhaustive or to limit the invention to the precise forms disclosed; obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. Throughout the specification, the terms "including" and "in which" are used as the plain-English equivalents of the respective terms "comprising" and "wherein," respectively. Moreover, the terms "first," "second," and "third," etc., are used merely as labels, and are not intended to impose numerical requirements on or to establish a certain ranking of importance of their objects.

LIST OF REFERENCE SIGNS 100, 200, 300, 400, 500 test arrangement
101, 201, 301 rotatable device
102, 202, 302 axis
103, 203, 303 first test antenna
104, 404 first antenna positioning means
105, 205 elevation direction
106, 206, 306 second test antenna
107 second antenna positioning means
108, 208 azimuth direction
109 guide arrangement
215, 416 guide
216, 316 slide
217, 417 arc-shaped section
218 azimuth positioner
219 vertical guide
220, 320 slide
221 arc-shaped section
330, 331 gantry arrangement
332, 333 rails
401, 402, 403, 404 antenna elements
405, 406 antenna elements
540 test controller
541 beamforming instructions
542 emissions
543 test signals
190, 290, 390, 590 device under test

The invention claimed is:

1. A test arrangement for testing a device under test, the test arrangement comprising:
a rotatable device support for carrying the device under test at least rotatable in one axis,
a first test antenna and a second test antenna,
a first antenna positioning means for moving the first test antenna relative to the device under test in elevation direction, and
a second antenna positioning means for moving the second test antenna relative to the device under test in azimuth direction and elevation direction.

2. The test arrangement according to claim 1, wherein the first antenna positioning means comprises a guide with a slide and a controllable drive unit coupled to the guide and/or the slide, wherein the first test antenna is coupled to the slide for controllably moving the first test antenna in elevation direction relative to the device under test.

3. The test arrangement according to claim 2, wherein the guide comprises an arc-shaped section that extends from a side of the rotatable device support to over the rotatable device support.

4. The test arrangement according to claim 1, wherein the second antenna positioning means comprises an azimuth positioner for positioning the second test antenna relative to the device under test in azimuth direction and wherein the second antenna positioning means comprises an elevation positioner for positioning the second test antenna relative to the device under test in elevation direction.

5. The test arrangement according to claim 4, wherein the elevation positioner comprises a vertical guide and a slide, wherein the second test antenna is coupled to the slide.

6. The test arrangement according to claim 5, wherein the vertical guide comprises an arc-shaped section that extends from a side of the rotatable device support to over the rotatable device support.

7. The test arrangement according to claim 5, wherein the elevation positioner comprises a controllable drive unit coupled to the guide and/or the slide, and wherein the drive unit controllably moves the slide on the guide.

8. The test arrangement according to claim 1, wherein the first antenna positioning means and/or the second antenna positioning means comprises a gantry-like arrangement.

9. The test arrangement according to claim 1, wherein the first test antenna and/or the second test antenna comprises a switchable array of antenna elements.

10. The test arrangement according to claim 1, wherein the rotatable device support comprises a rotation device for rotating the device under test.

11. The test arrangement according to claim 1, wherein the rotatable device support comprises an elevation device for moving the device under test in a vertical axis.

12. The test arrangement according to claim 1, comprising a test controller communicatively coupled to the first test antenna and the second test antenna, wherein the test controller communicates beamforming instructions to the device under test via at least one of the first test antenna and the second test antenna.

13. The test arrangement according to claim 12, wherein the test controller measures emissions of the device under test via at least one of the first test antenna and the second test antenna and/or wherein the test controller transmits test signals to the device under test via at least one of the first test antenna and the second test antenna.

14. The test arrangement according to claim 13, wherein the test controller comprises a function switch that switches the first test antenna and/or the second test antenna from a communication function to a measurement function or from a measurement function to a communication function.

15. The test arrangement according to claim 12, wherein the test controller provides beamforming instructions to the device under test that instruct the device under test to configure the antenna with a plurality of beams and sequentially performs measurements for individual beams of the plurality of beams.

16. A test method for testing a device under test, the method comprising:
carrying the device under test at least rotatable in one axis,
moving a first test antenna relative to the device under test in elevation direction,
moving a second test antenna relative to the device under test in azimuth direction and elevation direction, and
testing the device under test with the first test antenna and the second test antenna.

17. The test method according to claim 16, wherein moving the first test antenna comprises coupling the first test antenna to a slide and moving the slide on a guide in elevation direction relative to the device under test.

18. The test method according to claim 17, wherein moving the slide comprises moving the slide on an arc-shaped section of the guide that extends from a side of the device under test to over the device under test.

19. The test method according to claim 16, wherein moving the second test antenna comprises positioning the second test antenna relative to the device under test in azimuth direction and positioning the second test antenna relative to the device under test in elevation direction.

20. The test method according to claim 19, wherein positioning the second test antenna in elevation direction comprises moving a slide on a vertical guide, wherein the second test antenna is coupled to the slide.

21. The test method according to claim 20, wherein moving the slide comprises moving the slide on an arc-shaped section of the guide that extends from a side of the device under test to over the device under test.

22. The test method according to claim 16, wherein moving the first test antenna and/or moving the second test antenna comprises moving the respective antenna with a gantry-like arrangement.

23. The test method according to claim 16, wherein moving the first test antenna and/or moving the second test antenna comprises selecting an antenna element of a switchable array of antenna elements.

24. The test method according to claim 16, wherein carrying the device under test comprises rotating the device under test.

25. The test method according to claim 16, wherein carrying the device under test comprises moving the device under test in a vertical axis.

26. The test method according to claim 16, comprising communicating beamforming instructions to the device under test via at least one of the first test antenna and the second test antenna.

27. The test method according to claim 26, comprising measuring emissions of the device under test via at least one of the first test antenna and the second test antenna and/or transmitting test signals to the device under test via at least one of the first test antenna and the second test antenna.

28. The test method according to claim 27, comprising switching the first test antenna and/or the second test antenna from a communication function to a measurement function or from a measurement function to a communication function.

29. The test method according to claim 26, comprising providing beamforming instructions to the device under test that instruct the device under test to configure the antenna with a plurality of beams and sequentially performing measurements for individual beams of the plurality of beams.

* * * * *